US009473067B2

(12) United States Patent
Shi et al.

(10) Patent No.: US 9,473,067 B2

(45) Date of Patent: Oct. 18, 2016

(54) REDUCING MISMATCH CAUSED BY POWER/GROUND ROUTING IN MULTI-CORE VCO STRUCTURE

(71) Applicant: QUALCOMM Incorporated, San Diego, CA (US)

(72) Inventors: Jianlei Shi, Milpitas, CA (US); Jeongsik Yang, San Jose, CA (US); Young Gon Kim, San Jose, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 32 days.

(21) Appl. No.: 14/251,274

(22) Filed: Apr. 11, 2014

(65) Prior Publication Data

US 2015/0295535 A1 Oct. 15, 2015

(51) Int. Cl.

| | |
|---|---|
| ***H03B 5/02*** | (2006.01) |
| ***H03B 5/08*** | (2006.01) |
| ***H03B 27/00*** | (2006.01) |
| ***H03B 5/12*** | (2006.01) |

(52) U.S. Cl.

CPC *H03B 5/08* (2013.01); *H03B 5/02* (2013.01); *H03B 5/1212* (2013.01); *H03B 27/00* (2013.01)

(58) Field of Classification Search

CPC ............ H03B 1/00; H03B 5/08; H03B 5/12; H03B 27/00

USPC ..................................................... 331/46, 56

See application file for complete search history.

(56) References Cited

U.S. PATENT DOCUMENTS

| | | | | |
|---|---|---|---|---|
| 6,909,336 | B1 | 6/2005 | Rajagopalan et al. | |
| 7,463,106 | B2 | 12/2008 | Shin et al. | |
| 7,595,700 | B2 | 9/2009 | Byun et al. | |
| 8,058,934 | B2 * | 11/2011 | Rangarajan et al. | 331/46 |
| 8,686,805 | B2 * | 4/2014 | Nylen | 331/167 |
| 2004/0066241 | A1 * | 4/2004 | Gierkink et al. | 331/46 |
| 2007/0013456 | A1 | 1/2007 | Lee et al. | |
| 2009/0289727 | A1 * | 11/2009 | El Rai | 331/46 |
| 2011/0050354 | A1 * | 3/2011 | Hirashiki et al. | 332/105 |
| 2011/0057732 | A1 * | 3/2011 | Taylor et al. | 331/46 |
| 2011/0148535 | A1 * | 6/2011 | Lee | 331/117 FE |
| 2011/0221530 | A1 | 9/2011 | Sutardja et al. | |
| 2012/0242446 | A1 | 9/2012 | Wu | |
| 2012/0286879 | A1 | 11/2012 | Nylen | |
| 2013/0082793 | A1 * | 4/2013 | Eldredge et al. | 331/167 |
| 2013/0099870 | A1 * | 4/2013 | Terrovitis | 331/56 |
| 2014/0292419 | A1 * | 10/2014 | Ragonese et al. | 331/46 |

OTHER PUBLICATIONS

Si C., et al., "A fully integrated direct-conversion digital satellite tuner in 0.18 μm CMOS," Journal of Semiconductors, Apr. 2011, vol. 32 (4), pp. 045004-1 to 045004-5.

International Search Report and Written Opinion—PCT/US2015/020866—ISA/EPO—Sep. 11, 2015.

Partial International Search Report—PCT/US2015/020866—ISA/EPO—Jun. 16, 2016.

* cited by examiner

*Primary Examiner* — Levi Gannon

(74) *Attorney, Agent, or Firm* — Patterson & Sheridan, L.L.P.

(57) ABSTRACT

Reducing coupling and mismatch in multi-core VCOs, including: arranging a plurality of inductors in a plurality of VCO cores in a parallel differential inductor configuration with shared leads to form a single node, wherein the plurality of inductors includes at least a first inductor and a second inductor; connecting power/ground traces to the first inductor from a first side only; and connecting the power/ground traces to the second inductor from another side different from the first side only to avoid making a current loop.

20 Claims, 3 Drawing Sheets

REDUCING MISMATCH CAUSED BY POWER/GROUND ROUTING IN MULTI-CORE VCO STRUCTURE

BACKGROUND

1. Field

This invention relates to multi-core voltage-controlled oscillators (VCOs), and more specifically, to coupling and mismatch in the power/ground trace routing of the multi-core VCOs.

2. Background

Recent developments in wireless communication technology have allowed an entire radio frequency (RF) transceiver to be implemented on a single semiconductor chip. However, integrating the RF transceiver on a single chip presents a number of challenges. For example, a single-chip solution may require at least two voltage-controlled oscillators (VCOs) to be running on the chip at the same time. Such a configuration may produce undesired interaction between the cores of the VCOs due to various types of mutual coupling mechanisms, which may result in spurious receiver responses and unwanted frequencies in the transmit spectrum. The primary mutual coupling mechanism is the electromagnetic (EM) coupling between the inductors and/or capacitors of the resonators.

SUMMARY

The present invention provides methods, systems, and apparatus for reducing coupling and mismatch caused by the power/ground trace routing in multi-core VCOs.

In one embodiment, a method for reducing coupling and mismatch in multi-core voltage-controlled oscillators (VCOs) is disclosed. The method includes: arranging a plurality of inductors in a plurality of VCO cores in a parallel differential inductor configuration with shared leads to form a single node, wherein the plurality of inductors includes at least a first inductor and a second inductor; connecting power/ground traces to the first inductor from a first side only; and connecting the power/ground traces to the second inductor from another side different from the first side only to avoid making a current loop.

In another embodiment, a system of multi-core VCOs is disclosed. The system includes: a plurality of VCO cores, each VCO core comprising at least one inductor and a bank of capacitors and devices, the at least one inductor in each VCO core forming a plurality of inductors, wherein the plurality of inductors, including at least a first inductor and a second inductor, is arranged in a parallel differential inductor configuration with shared leads to form a single node; a first connector configured to connect power/ground traces to the first inductor from a first side only; and a second connector configured to connect to the power/ground traces to the second inductor from another side different from the first side only to avoid making a current loop.

In another embodiment, a multi-core VCO apparatus configured to reduce coupling and mismatch is disclosed. The apparatus includes: means for reducing coupling and mismatch among a plurality of inductors in a plurality of VCO cores by arranging the plurality of inductors, including at least a first inductor and a second inductor, in a parallel differential inductor configuration with shared leads to form a single node; means for connecting power/ground traces to the first inductor from a first side only; and means for connecting to the power/ground traces to the second inductor from another side different from the first side only to avoid making a current loop.

Other features and advantages of the present invention should be apparent from the present description which illustrates, by way of example, aspects of the invention.

BRIEF DESCRIPTION OF THE DRAWINGS

The details of the present invention, both as to its structure and operation, may be gleaned in part by study of the appended further drawings, in which like reference numerals refer to like parts, and in which.

DETAILED DESCRIPTION

As described above, integrating an RF transceiver on a single chip may require a plurality of voltage-controlled oscillators (VCOs) to be running on the chip at the same time. Such a configuration may produce undesired interaction between the cores of the VCOs due to various types of mutual coupling mechanisms. In multi-core VCOs, an asymmetric power/ground trace routing can cause an amplitude mismatch. However, a fully symmetric power/ground trace routing with connections from both sides of the VCO core also results in a closed loop of metal, which can pick up undesirable coupling noises and spurs. The mismatch in the electromagnetic (EM) coupling also leads to differences in the current flow on the positive node and the negative node of the differential inductor and results in an increased amplitude on one oscillation node but decreased amplitude on the other oscillation node. This can lead to performance degradation in phase noise. Further, the lower amplitude on one node can lead to failure of functions if the following buffer is not designed with enough tolerance of input amplitude.

Certain embodiments as described herein provide for reducing coupling and mismatch caused by the power/ground routing in multi-core VCOs. As explained above, in multi-core VCOs, the asymmetric power/ground trace routing can cause amplitude mismatch, while the fully symmetric power/ground trace routing with connections from both sides of the VCO core results in undesirable coupling noises and spurs. To break the loop, the power/ground trace routing is connected only from one side, and the current flows only on one side of the VCO core. After reading this description it will become apparent how to implement the invention in various implementations and applications. Although various implementations of the present invention will be described herein, it is understood that these implementations are presented by way of example only, and not limitation. As such, this detailed description of various implementations should not be construed to limit the scope or breadth of the present invention.

Figure 1:
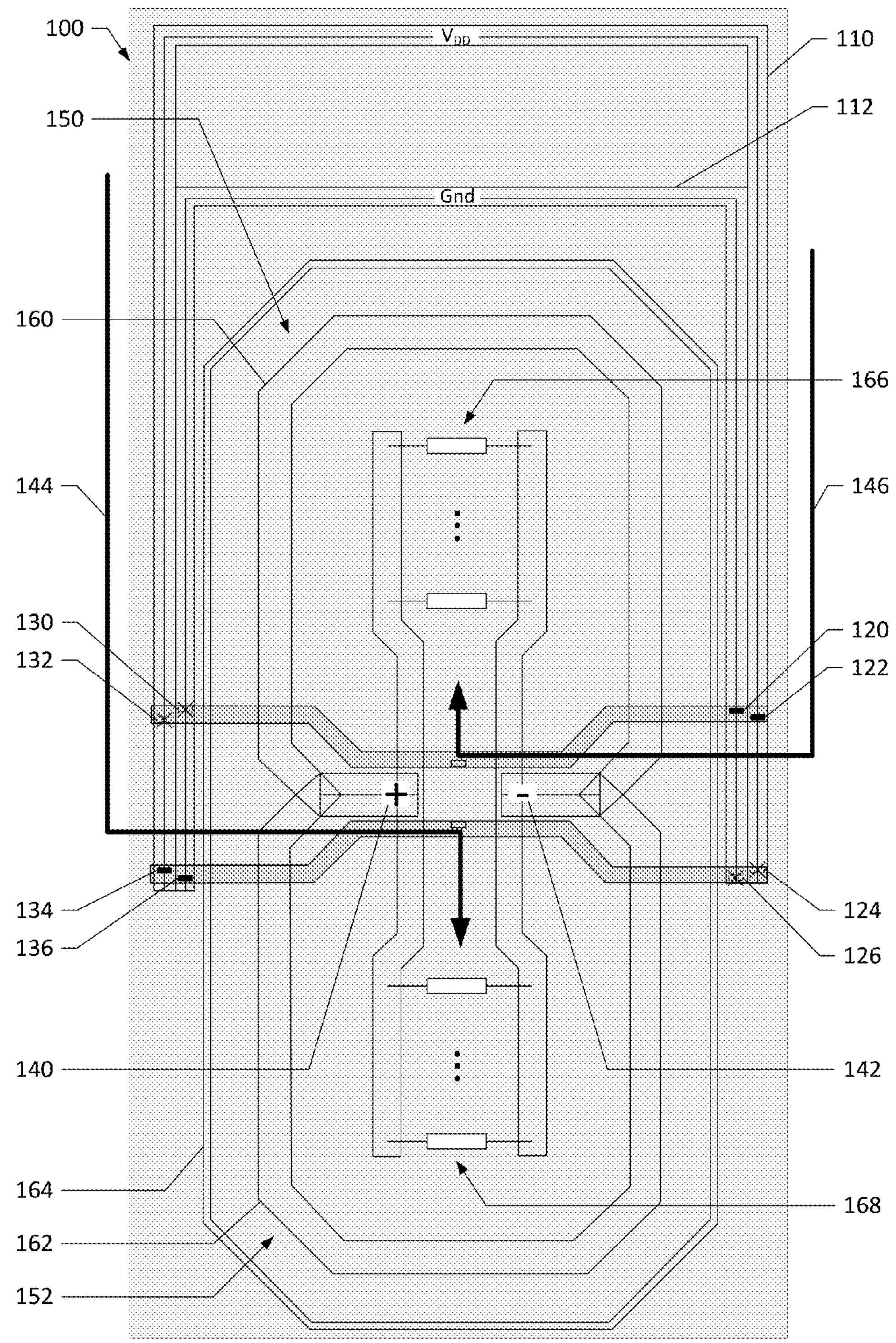
FIG. 1 is a multi-core VCO structure using a quasi-symmetric routing of the power/ground traces in accordance with one embodiment of the present invention.

In one embodiment of the multi-core VCO structure 100 shown in FIG. 1, a quasi-symmetric routing of the power/ground traces is used. In one embodiment, the VCO structure 100 is a portion of a semiconductor chip, for example, an RF transceiver. In another embodiment, In the illustrated embodiment of FIG. 1, the VCO structure 100 includes two VCO cores 150, 152, one 150 at the top and one 152 at the bottom (effectively forming a plurality of VCOs). The top core 150 includes a first inductor 160 and a first bank of capacitors and other active devices 166. The bottom core 152 includes a second inductor 162 and a second bank of capacitors and other active devices 168. The two cores 150, 152 are enclosed by a grounded metal guard ring 164, which is useful for isolating the couplings of the inductors 160, 162 to other on-chip inductors as well as other components.

In the illustrated embodiment of FIG. 1, the two inductors 160, 162 of the two cores 150, 152 share the leads and nodes and connect in a parallel configuration. For example, the two inductors 160, 162 share positive leads as a single node 140 and negative leads as a single node 142 in a differential inductor configuration. Each core 150, 152 is also powered by power ($V_{DD}$) 110 and ground ($G_{ND}$) 112 traces. For example, the top core 150 can be coupled to the power trace 110 through via connections 122 (right), 132 (left), while the bottom core 152 can be coupled to the power trace 110 through via connections 124 (right), 134 (left). Similarly, the top core 150 can be coupled to the ground trace 112 through via connections 120 (right), 130 (left), while the bottom core 152 can be coupled to the ground trace 112 through via connections 126 (right), 136 (left).

However, as explained above, in multi-core VCOs, the fully symmetric power/ground trace routing with connections from both sides results in a closed loop of metal which causes undesirable coupling noises and spurs. Thus, the power/ground trace routing is connected only from one side for each VCO core. For example, in the illustrated embodiment of FIG. 1, the top core 150 is connected to the power trace 110 through a right-side via connection 122 only, while the bottom core 152 is connected to the power trace 110 through a left-side via connection 134 only. Therefore, to break the loop, the right-side via connection 124 to the power trace 110 for the bottom core 152 is disconnected, and the left-side via connection 132 to the power trace 110 for the top core is disconnected. Similarly, the top core 150 is connected to the ground trace 112 through a right-side via connection 120 only, while the bottom core 152 is connected to the ground trace 112 through a left-side via connection 136 only. Again, to break the loop, the right-side via connection 126 to the ground trace 112 for the bottom core 152 is disconnected, and the left-side via connection 130 to the ground trace 112 for the top core is disconnected. The disconnections are marked with an 'X' mark in FIG. 1.

Figure 2:
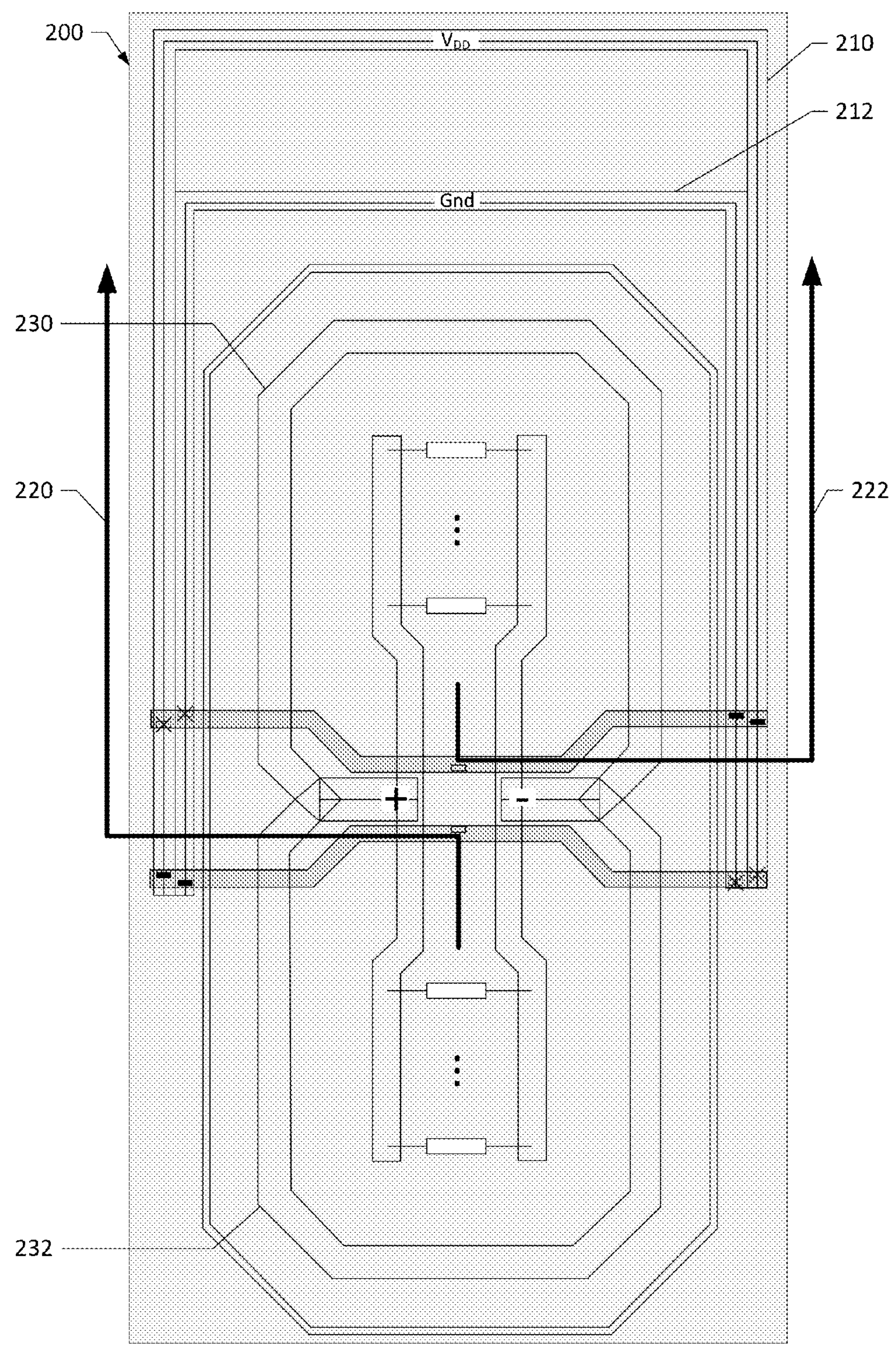
FIG. 2 is another embodiment of the multi-core VCO structure using a quasi-symmetric routing of the power/ground traces.

Accordingly, the power/ground traces of the top and bottom cores 150, 152 are separated with no direct metal connections, and no metal loops are formed. Thus, FIG. 1 shows the current flow 144 from the power trace 110 to the bottom core 152 and the current flow 146 from the power trace 110 to the top core 150. FIG. 2 is another embodiment of a multi-core VCO structure 200 powered by the power trace 210 and the ground trace 212. FIG. 2 shows the current flow 222 from the top core 230 to the ground trace 212 and the current flow 220 from the bottom core 232 to the ground trace 212. Therefore, the top core 150 has more current flow 146, 222 on the right side than the left side, while the bottom core 152 has more current flow 144, 220 on the left side than the right side. Accordingly, when analyzed separately, each core 150, 152 has mismatched current flowing out of the two nodes 140, 142.

In the illustrated embodiments of FIG. 1 and FIG. 2, when the two cores are analyzed separately, the top core 150 has a larger current flow on the negative node 142 than the positive node 140, while the bottom core 152 has a larger current flow on the positive node 140 than the negative node 142. Thus, the difference in the current flow leads to an amplitude mismatch at the positive and negative oscillation nodes. However, when the two VCO cores 150, 152 are connected in parallel (as shown in FIG. 1 and FIG. 2) by sharing the positive node 140 and the negative node 142, the amplitude mismatch is substantially reduced or even cancelled in some cases. This substantially reduces the performance degradation at no additional cost.

In an alternative embodiment, the routing of the power/ground trace is made from top and bottom of the VCO cores rather than from left and right sides of the VCO cores. This alternative embodiment would address the asymmetric current problem. However, this embodiment would also make the routing of the traces challenging and may result in a mismatch for the top and bottom cores due to the power/ground IR drop and other couplings to capacitor bank routing traces. In a further embodiment, a symmetric routing on both right and left sides can be used, but with a break of the metal loop in the middle.

Figure 3:
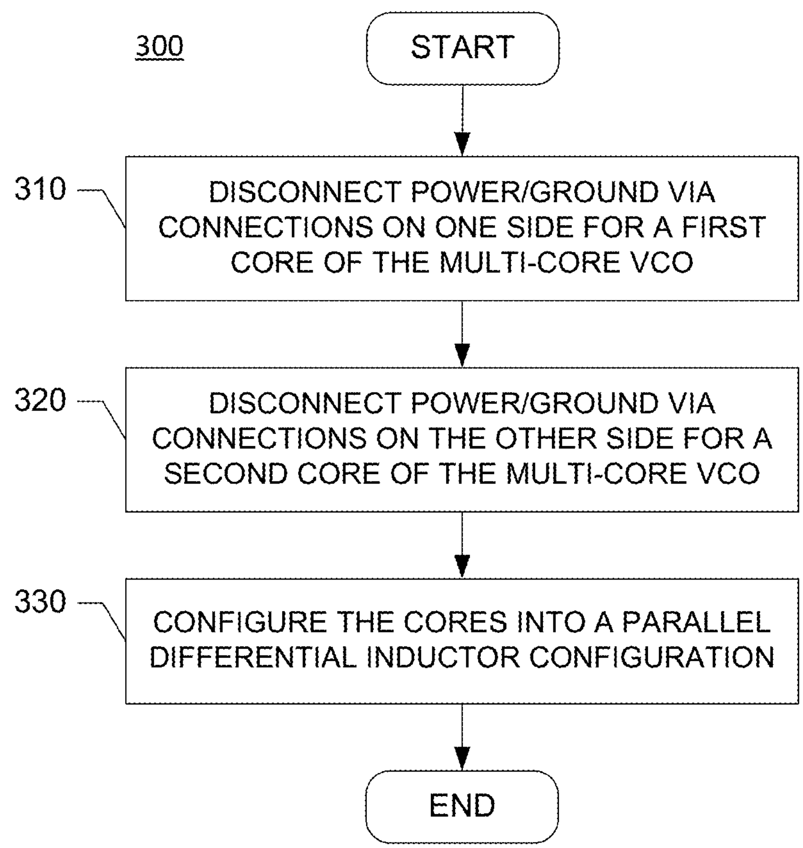
FIG. 3 is a functional flow diagram illustrating a method for reducing coupling and/or mismatch caused by the power/ground routing in multi-core VCOs in accordance with one embodiment of the present invention.

FIG. 3 is a functional flow diagram illustrating a method 300 for reducing coupling and/or mismatch caused by the power/ground trace routing in multi-core VCOs in accordance with one embodiment of the present invention. In the illustrated embodiment of FIG. 3, the power/ground trace routing is connected from one side only. For example, the power/ground via connections for the first core of the multi-core VCOs are disconnected on one side, at step 310. Then, the power/ground via connections for the second core of the multi-core VCOs are disconnected on the other side, at step 320. Thus, in examples shown in FIG. 1 and FIG. 2, the power/ground traces of the top and bottom cores 150, 152 are separated with no direct metal connections, and no metal loops are formed. However, when the two cores are analyzed separately, the top core 150 has a larger current flow on the negative node 142 than the positive node 140, while the bottom core 152 has a larger current flow on the positive node 140 than the negative node 142. Therefore, as described above, the differences in the current flow still lead to the amplitude mismatch at positive and negative oscillation nodes. Accordingly, the first and second cores of the multi-core VCOs are configured into a parallel differential inductor configuration, at step 330, to substantially reduce or even cancel the amplitude mismatch.

Although several embodiments of the invention are described above, many variations of the invention are possible. For example, although the illustrated embodiments make power/ground trace connections on the left and right sides, the power/ground trace connections can be made from the top and bottom, or from both top/bottom and left/right sides. Further, features of the various embodiments may be combined in combinations that differ from those described above. For example, although the connections for the power/ground traces are made with via connectors, other suitable connectors such as wire connections can be used in place of the via connectors. Moreover, for clear and brief description, many descriptions of the systems and methods have been simplified. Many descriptions use terminology and structures of specific standards. However, the disclosed systems and methods are more broadly applicable.

Those of skill in the art will appreciate that the various illustrative blocks and modules described in connection with the embodiments disclosed herein can be implemented in various forms. Some blocks and modules have been described above generally in terms of their functionality.

How such functionality is implemented depends upon the design constraints imposed on an overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block without departing from the invention.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A method for reducing coupling and mismatch in multi-core VCOs, the method comprising:

operating a first VCO core comprising a first inductor;

operating a second VCO core comprising a second inductor, wherein the first inductor and the second inductor are configured as parallel inductors with first shared leads forming a first node and second shared leads forming a second node;

directing a current flow for the first VCO core via power and ground traces connected to the first VCO core from a first side only, wherein the first side is adjacent to the first node formed by the first shared leads; and directing a current flow for the second VCO core via the power and ground traces connected to the second VCO core from a second side only, to avoid making a current loop, wherein the second side is different from the first side and is adjacent to the second node formed by the second shared leads, wherein the first side is closer to the first node than to the second node, and wherein the second side is closer to the second node than to the first node.

2. The method of claim 1, wherein directing the current flow for the first VCO core via the power and ground traces and directing the current flow for the second VCO core via the power and ground traces comprise directing the current flows for the first and second VCO cores using via connectors connected between the power and ground traces and the first and second VCO cores.

3. The method of claim 2, wherein no via connectors are connected between the power and ground traces and the first VCO core on the second side and wherein no via connectors are connected between the power and ground traces and the second VCO core on the first side.

4. The method of claim 1, further comprising isolating couplings of the first and second inductors to other components using a guard ring enclosing the first and second VCO cores.

5. The method of claim 1, wherein the first shared leads comprise positive leads and the second shared leads comprise negative leads of the parallel inductors.

6. The method of claim 1, further comprising directing the current flow of the first inductor and the current flow of the second inductor to a third side different from the first and second sides.

7. The method of claim 1, further comprising directing the current flow for the first VCO core and the current flow for the second VCO core symmetrically on the first side and the second side without forming a current loop.

8. A system of multi-core voltage-controlled oscillators (VCOs), the system comprising:

a first VCO core comprising a first inductor;

a second VCO core comprising a second inductor, wherein the first inductor and the second inductor are arranged in a parallel configuration with first shared leads of the first and second inductors forming a first node and second shared leads of the first and second inductors forming a second node;

a first connector configured to connect power and ground traces to the first VCO core from a first side of the parallel configuration only, wherein the first side is adjacent to the first node formed by the first shared leads; and a second connector configured to connect the power and ground traces to the second VCO core from a second side of the parallel configuration only, to avoid making a current loop, wherein the second side is different from the first side and is adjacent to the second node formed by the second shared leads, wherein the first side is closer to the first node than to the second node, and wherein the second side is closer to the second node than to the first node.

9. The system of claim 8, wherein the first connector and the second connector are via connectors.

10. The system of claim 9, wherein no via connectors are connected between the power and ground traces and the first VCO core on the second side and wherein no via connectors are connected between the power and ground traces and the second VCO core on the first side.

11. The system of claim 8, further comprising a guard ring configured to enclose the first and second VCO cores to isolate couplings of the first and second inductors to other components.

12. The system of claim 11, wherein the guard ring is a grounded metal guard ring.

13. The system of claim 8, wherein the power and ground traces are configured quasi-symmetrically.

14. The system of claim 8, wherein the first shared leads comprise positive leads and the second shared leads comprise negative leads of the parallel configuration.

15. The system of claim 8, wherein the power and ground traces are connected to a third side different from the first and second sides.

16. The system of claim 8, wherein the power and ground traces are configured in a symmetric configuration on the first side and the second side, without forming a metal loop.

17. An apparatus configured to reduce coupling and mismatch, the apparatus comprising:

first means for generating a first oscillating signal comprising a first inductor;

second means for generating a second oscillating signal comprising a second inductor, wherein the first inductor and the second inductor are configured as parallel inductors with first shared leads forming a first node and second shared leads forming a second node;

first means for directing a current flow to the first means for generating from a first side only, wherein the first side is adjacent to the first node formed by the first shared leads; and second means for directing a current flow to the second means for generating from a second side only, to avoid making a current loop, wherein the second side is different from the first side and is adjacent to the second node formed by the second shared leads, wherein the first side is closer to the first node than to the second node, and wherein the second side is closer to the second node than to the first node.

18. The apparatus of claim 17, wherein the first means for directing the current flow to the first means for generating and the second means for directing the current flow to the second means for generating comprise via connectors.

19. The apparatus of claim 17, further comprising means for isolating couplings of the first and second inductors to other components.

20. The apparatus of claim 17, further comprising third means for directing a current flow to a third side different from the first and second sides.

* * * * *